United States Patent [19]
Krautschneider et al.

[11] Patent Number: 5,854,112
[45] Date of Patent: Dec. 29, 1998

[54] TRANSISTOR ISOLATION PROCESS

[75] Inventors: Wolfgang H. Krautschneider, Ottobrunn; Werner M. Klingenstein, Kirchheim, both of Germany

[73] Assignee: Siemens Aktiengesellschaft, Munich, Germany

[21] Appl. No.: 563,882

[22] Filed: Nov. 21, 1995

Related U.S. Application Data

[63] Continuation of Ser. No. 408,091, Mar. 21, 1995, abandoned, which is a continuation of Ser. No. 40,319, Mar. 30, 1993, abandoned.

[51] Int. Cl.$^6$ ..................................................... H01L 21/76
[52] U.S. Cl. ........................ 438/294; 438/297; 438/296; 438/425; 438/587; 438/592; 438/595
[58] Field of Search ..................... 438/129, 220, 438/225, 297, 296, 425, 587, 592, 595, 221; 251/202, 305, 374, 390, 396, 398

[56] References Cited

U.S. PATENT DOCUMENTS

| | | |
|---|---|---|
| 3,665,265 | 5/1972 | Fujimoto . |
| 4,181,537 | 1/1980 | Ichinck . |
| 4,373,248 | 2/1983 | McElroy . |
| 4,679,303 | 7/1987 | Chen et al. ............................... 29/571 |
| 4,737,828 | 4/1988 | Brown ..................................... 357/23.1 |
| 4,968,900 | 11/1990 | Esquivel . |
| 5,015,601 | 5/1991 | Yoshikawa . |
| 5,039,625 | 8/1991 | Reisman et al. .......................... 437/69 |
| 5,100,830 | 3/1992 | Morita . |
| 5,160,986 | 11/1992 | Belleza . |
| 5,278,438 | 1/1994 | Kim et al. . |
| 5,469,383 | 11/1995 | McElroy et al. . |
| 5,633,187 | 5/1997 | Hsu . |
| 5,646,888 | 7/1997 | Mori . |
| 5,679,602 | 10/1997 | Lin et al. . |
| 5,763,309 | 6/1998 | Chang . |
| 5,766,992 | 6/1998 | Chou et al. . |

FOREIGN PATENT DOCUMENTS

| | | |
|---|---|---|
| 0078890 | 5/1983 | European Pat. Off. . |
| 0119729 | 9/1984 | European Pat. Off. . |
| 40211274 | 6/1990 | Germany . |
| 54-3350 | 2/1979 | Japan . |
| 57-37830 | 3/1982 | Japan . |
| 57-71144 | 5/1982 | Japan . |
| 58-61672 | 4/1983 | Japan . |
| 59-76472 | 5/1984 | Japan . |
| 61-102750 | 5/1986 | Japan . |
| 62-31177 | 2/1987 | Japan . |
| 5-226465 | 9/1993 | Japan . |
| 5-299414 | 11/1993 | Japan . |

OTHER PUBLICATIONS

"Fully Scalable Gain Memory Cell for Future Drams", Krautschneider et al., Microelectronic Engineering 15 (1991), Elsevier, pp. 367–370.

*Primary Examiner*—George R. Fourson
*Attorney, Agent, or Firm*—Adel A. Ahmed

[57] ABSTRACT

In the manufacture of semiconductor devices on a single substrate, said devices comprising a source region, a drain region and a gate therebetween, forming an isolation region after formation of the gate between said devices, thereby reducing required tolerances between devices and rows of devices and minimizing space requirements on the substrate for the array. A conventional isolation region between adjacent devices can be formed first, the layers comprising the gate deposited, the gate formed by etching through the layers, and a second isolation region between rows of devices formed after the gate etch. This reduces the built-in tolerances required between rows of devices, and reduces the spacing requirements between the rows.

7 Claims, 3 Drawing Sheets

TRANSISTOR ISOLATION PROCESS

CROSS-REFERENCE TO RELATED APPLICATION

This is a continuation of Ser. No. 08/408,091 filed Mar. 21, 1995, which is a continuation of Ser. No. 08/040,319 filed Mar. 30, 1993, both now abandoned.

This invention relates to the manufacture of an array of semiconductor devices such as transistors on a semiconductor substrate. More particularly, this invention relates to a process for isolating adjacent, closely spaced transistors on a semiconductor substrate.

BACKGROUND OF THE INVENTION

A plurality of metal-on-silicon (MOS) field effect transistors (FET) are made in a semiconductor substrate such as a silicon wafer, which can be separately addressed. In order to reduce cross talk between devices, they must be spaced from each other; however, in order to increase the number of devices on a single substrate, they must be as close together as possible. A major goal of research in the past decade in the semiconductor business has been to reconcile these conflicting requirements. Devices are being made smaller and smaller, and as large a number of devices as possible are being made on a single substrate or chip.

As devices are made closer together (high density), techniques have been developed to isolate the active area of each device from its neighboring devices on all sides. In one technique, called trench isolation, at the start of device processing, an opening or trench is made into the silicon substrate surrounding the source, gate and drain regions of each transistor device, and the trench is filled with a dielectric material, such as silicon oxide. This trench provides a barrier between devices. However, allowance must be made for alignment tolerances in both the lateral and horizontal directions between devices on the substrate, which increases the device size beyond the actual active area.

In an alternative isolation technique, a surface oxidation layer is used. A nitride or other mask is provided over the area where the active device is to be formed; e.g., boron ions are implanted in the non-masked portions as a channel stop to define an isolation area around the regions where the source, gate and drain regions are to be formed within the substrate, and the isolation area is oxidized (LOCOS process). However, the oxide area may encroach into the active areas during subsequent device processing, and the channel stop dopants can diffuse into the active areas during subsequent processing steps. Thus the defined channel becomes narrower, which increases the FET threshold voltage and affects the current drive capability. Thus in order to maintain the desired channel width at the end of device processing, the channels originally must be made wider than the final width desired, to allow for such diffusion. Further, inevitable misalignment of photoresist patterning also requires that increased tolerances between devices are required, and thus the packing density of devices using this process is reduced.

Subsequent processing includes deposition of gate isolation and conductive polysilicon, silicon nitride and silicon oxide layers to form a gate stack, which is patterned to form the gate of the transistor. Ion implantation into the silicon substrate on either side of the gate follows to form source and drain regions which are self aligned with respect to the gate. State of the art transistors have gates able to be made as small as 0.5 micron or less, and thus the space on the substrate required by each transistor is minimized.

Since an array of MOS transistors is to be formed in a substrate, it would be desirable to keep the distance between rows of transistors as small as possible as well, but without requiring expensive additional processing to do so.

Thus it is desirable to develop a process to obtain the desired isolation of devices, but minimizing the space requirements between devices, the process being compatible with existing processing steps.

SUMMARY OF THE INVENTION

The present invention provides a process for minimizing the space requirements between rows of an array of transistors on a semiconductor substrate. In a first aspect of the present invention, a trench isolation between rows of transistors can be formed by adding a second isolation step during patterning of the gate stack. A first, conventional isolation is formed between adjacent transistor devices, followed by deposition of a gate stack. The gate stack is etched in conventional fashion, followed by a second isolation step, this second isolation formed between rows of transistors. Thus by adding a single isolation step to the process of making isolated MOS transistors, rows of transistors can also be isolated which, because they are formed after the gate processing is completed, do not require the tolerances that would be needed to be added if the isolation regions were processed prior to formation of the gate stack.

In another aspect of the present invention, isolation both between adjacent transistors and between rows of transistors can be carried out after formation of the gate stack.

In yet another aspect of the present invention, circuits that require a common source and drain region, e.g., inverter type circuits or memory cell arrays with gain memory cells, the second isolation process can be performed so that it is self aligned with respect to a gate stack having a spacer layer, using an etch technology that is selective with respect to the silicon oxide or silicon nitride used as spacers. Again, tolerances between devices do not have to be taken into account and adjacent MOS transistors and rows of transistors can be spaced with minimum design rules.

DETAILED DESCRIPTION OF THE INVENTION

Figure 1:
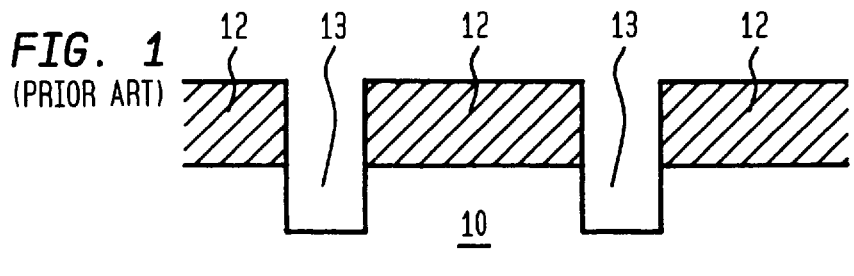
FIGS. 1–4 illustrate in cross section the processing steps of the prior art for making a transistor array.
Figure 2:
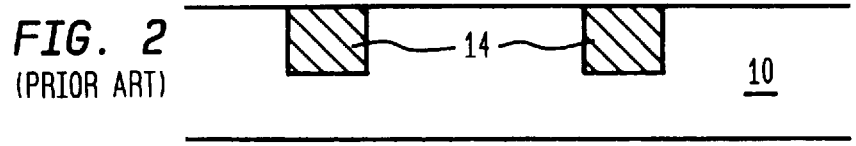

The prior art trench isolation process is described in detail in FIGS. 1–5. Referring to FIG. 1, the surface of a silicon wafer 10 is cleaned in known manner to remove contaminants and particles from the surface. To form isolation regions using shallow trench isolation techniques, a layer of photoresist 12 is put down and patterned. The wafer is etched to form openings 13, using standard photolithographic and etch techniques. The photoresist layer 12 is removed and silicon oxide is deposited in the openings, e.g., by CVD or PECVD deposition. The surface is then planarized and cleaned, as by, e.g., chemical mechanical polishing, leaving the dielectric-filled trench 14 to isolate the active devices, as shown in FIG. 2.

Figure 3:
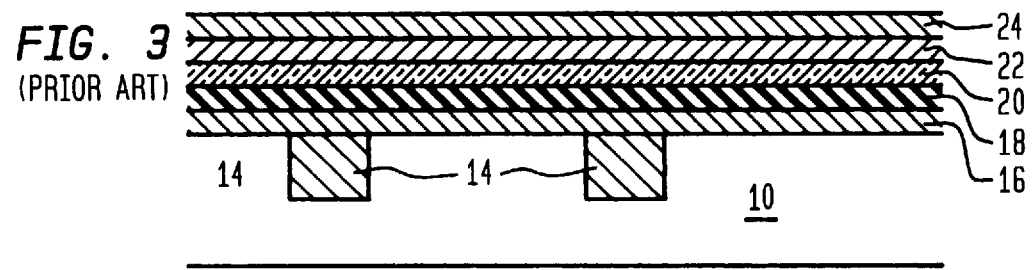
Figure 4:
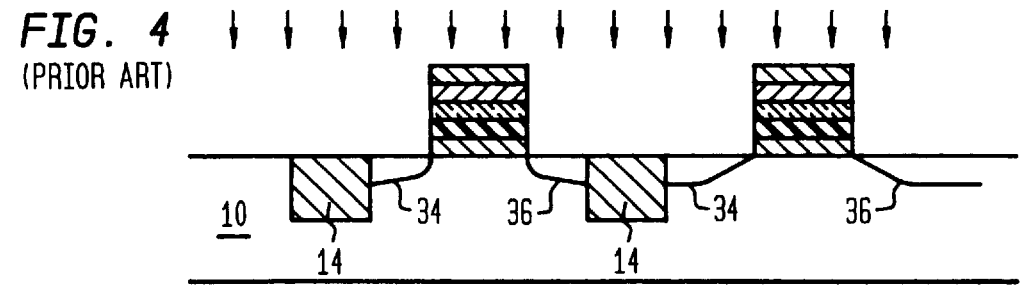
Figure 5:
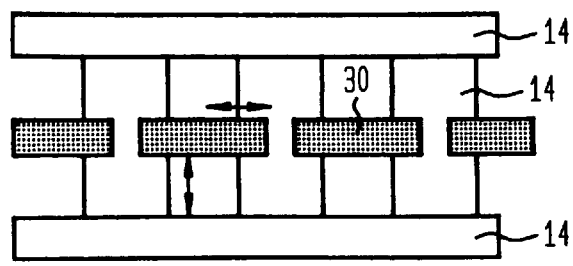
FIG. 5 is a plan view of a layout required for the manufacture of a prior art transistor array.

The gate is now formed by depositing sequentially a gate oxide layer 16, an n-doped conductive polysilicon layer 18, a silicide layer 20, a silicon nitride layer 22 and an oxide layer 24, as shown in FIG. 3. The gate stack is then structured by photoresist and etch techniques etching through the silicon oxide layer 24, the silicon nitride layer 22, the silicide layer 20, the polysilicon layer 18, with or without etching the gate oxide layer 16. The resultant structure of gate 30 is shown in FIG. 4.

The transistor source and drain regions are ion implanted into the silicon wafer 10, optimized to form dopant levels in the source and drain regions 34, 36 respectively, to minimize source and drain leakage current. The source and drain regions are thus aligned with the edges of the gate region, achieving minimum size for each transistor. However, the trench regions between adjacent transistors must be spaced both horizontally and transversely so that the final isolation or channel regions are of the desired width after the processing described above subsequent to their formation has been completed. Thus, even though each individual transistor is small, the space between adjacent transistors must be quite large to include a tolerance margin large enough to accommodate changes during the gate processing steps. These added tolerances are indicated by the arrows in the layout of FIG. 5.

Figure 6:
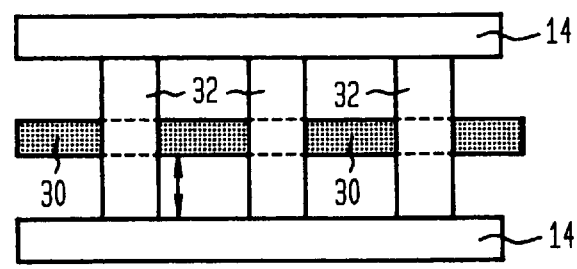
FIG. 6 is a plan view of a layout obtained in one embodiment of the present process.

In the process of the present invention, after forming first isolation regions 14 in conventional manner, the gate stack 30 is deposited and the gate is etched. A second isolation is performed at the same time or subsequent to, the gate etch, either by etching a trench 32 into the silicon between transistors and filling the trench in with a dielectric, see FIG. 6, or by oxidizing an exposed silicon surface to form a channel region in known manner. Thus although tolerances have to be provided in the case of the first isolation in the vertical direction, as shown by the arrows in FIG. 6, the isolation between devices in the horizontal direction is aligned with the gate and no additional tolerances or allowance for misalignment needs to be added. Thus the resultant array can have a much closer spacing in the horizontal direction between adjacent transistors, thereby increasing the number of devices that can be made in a silicon substrate.

Figure 7:
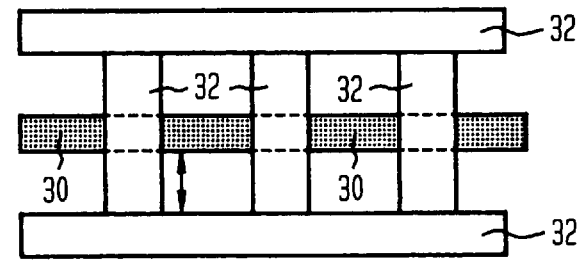
FIG. 7 is a plan view of a layout obtained in another embodiment of the present process.

In accordance with another embodiment of the invention, the first and second isolation steps can both be performed after the gate stack 30 has been deposited and the gate etched. FIG. 7 is a plan view of the resultant array of transistors; again, tolerances have to be provided in only one direction, between rows of transistors, but not between adjacent transistors.

As is known, when a surface or trench oxidation is the method of choice for forming an isolation region, the isolation properties of the isolation region obtained after both the first and second isolation steps can be enhanced by ion implanting a channel stop into the isolation region before oxidation.

A silicon oxide or silicon nitride spacer layer is formed on the sidewalls of the gate stack, as it is used in the manufacture of gain memory cells or EEPROMs wherein an oxide or a nitride spacer layer is processed along the sidewalls of a combined gate stack and planarized diode. Then the second isolation process step is performed in the transverse direction so that the entire spacing between the gate conductors can be utilized to compensate alignment tolerances. Thus in such case neither lateral nor transverse tolerances have to be provided between adjacent devices, and the transistors can be spaced using minimum design rules, limited by minimum resolution of patterning equipment only and no longer by overlay accuracy and tolerances.

Figure 8:
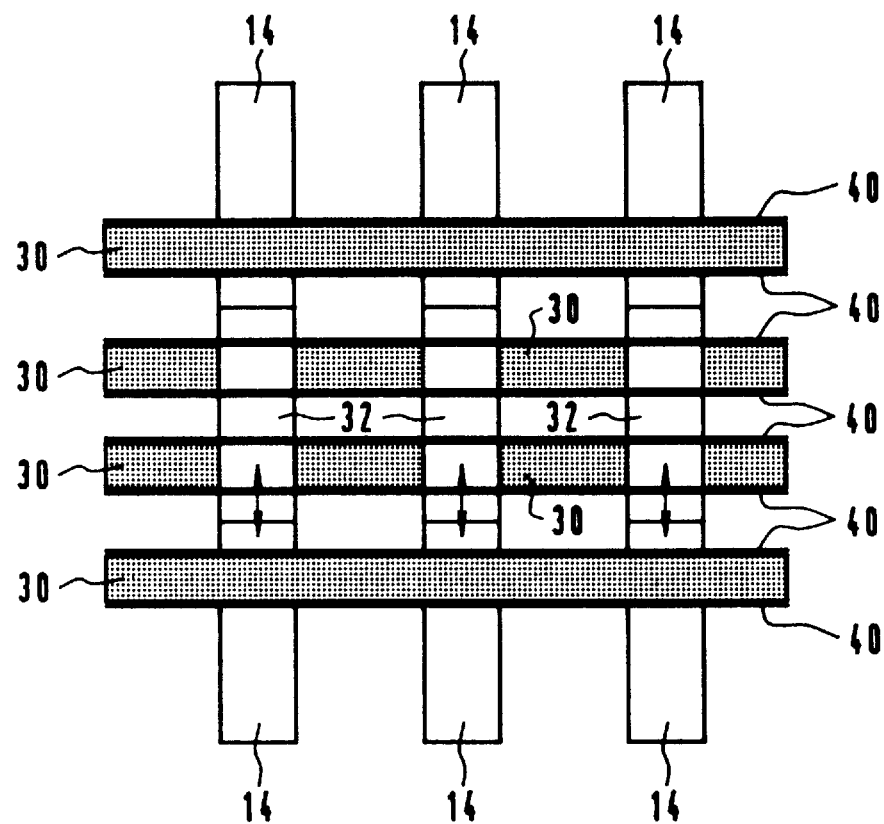
FIG. 8 is a plan view of a layout obtained in still another embodiment of the present process.

FIG. 8 is a plan view of a layout of an array of devices having spacers 40 along the sidewall of the gate stack and wherein tolerances do not have to be provided either between adjacent devices nor between adjacent rows of devices.

Although the present invention has been described in terms of particular embodiments and sequences of process steps, various changes can be made in the sequence of process steps and the types of devices being made without departing from the essence of this invention, and are meant to be included herein. The scope of the invention is meant only to be defined in terms of the appended claims.

We claim:

1. A process for minimizing space requirements for an array of adjacent semiconductor devices on a semiconductor substrate, said semiconductor devices each comprising a source, a drain and a gate therebetween wherein after each gate stack is formed, a spacer layer is formed along the sidewalls thereof and a first isolation region is formed in said substrate thereafter.

2. A process according to claim 1 wherein each gate comprises a gate stack comprising a layer of silicon oxide, a layer of conductive polysilicon, a layer of polysilicide and a layer of silicon nitride.

3. A process according to claim 1 wherein said first isolation region is made by etching a trench in said substrate and filling the trench with a dielectric material.

4. A process according to claim 3 wherein said dielectric material is silicon oxide.

5. A process according to claim 1 wherein said first isolation regions made by forming a field oxide layer by oxidation along the surface of said substrate surrounding the source and drain regions.

6. A process according to claim 5 wherein the surface of said substrate is ion implanted to form a channel stop prior to oxidation.

7. A process for minimizing space requirements for an array of semiconductor devices on a substrate, each semiconductor device including a source, a drain and a gate stack therebetween comprising sequentially depositing a polysilicon layer, a silicide layer and a protective layer over said substrate, forming an array of gate stacks by etching said sequential layers, forming a spacer layer on the sidewalls of each of said gate stacks, forming first isolation regions between adjacent devices, and forming second isolation regions between rows of devices, said second isolation regions aligned with said sidewall spacers.

* * * * *